US012604643B2

(12) United States Patent
Shi et al.

(10) Patent No.: US 12,604,643 B2
(45) Date of Patent: Apr. 14, 2026

(54) DISPLAY PANEL HAVING TOTAL REFLECTION INTERFACE FORMED BY LOW REFRACTION LAYER AND HIGH REFRACTION LAYER, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Bo Shi, Beijing (CN); Juntao Chen, Beijing (CN); Taofeng Xie, Beijing (CN); Cuicui Tan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 575 days.

(21) Appl. No.: 18/020,994

(22) PCT Filed: Apr. 21, 2022

(86) PCT No.: PCT/CN2022/088246
§ 371 (c)(1),
(2) Date: Feb. 13, 2023

(87) PCT Pub. No.: WO2023/201640
PCT Pub. Date: Oct. 26, 2023

(65) Prior Publication Data
US 2024/0268196 A1      Aug. 8, 2024

(51) Int. Cl.
*H10K 59/80* (2023.01)
*H10K 59/35* (2023.01)

(52) U.S. Cl.
CPC .......... *H10K 59/879* (2023.02); *H10K 59/35* (2023.02); *H10K 59/878* (2023.02)

(58) Field of Classification Search
CPC ... H10K 59/879; H10K 59/878; H10K 50/585
See application file for complete search history.

(56) References Cited

U.S. PATENT DOCUMENTS

2020/0388789 A1    12/2020   Cha et al.
2024/0055551 A1*    2/2024   Kanehiro ............... H05B 33/22

FOREIGN PATENT DOCUMENTS

CN          108269502 A      7/2018
CN          113113552 A      7/2021
(Continued)

OTHER PUBLICATIONS

Office Action dated Apr. 4, 2025, issued in counterpart CN Application No. 202280000827.5, with English translation. (20 pages).

*Primary Examiner* — Joseph L Williams
(74) *Attorney, Agent, or Firm* — WHDA, LLP

(57) ABSTRACT

A display panel includes a light-transmitting area and a display area including a first and a second display area, the first display area and the light-transmitting area constitute a transparent display area; the display area includes: a display substrate including a light-emitting area and a non-light-emitting area; a low refraction layer; a high refraction layer, the high refraction layer covering at least the light-emitting area and a side surface of the low refraction layer facing the light-emitting area; the refractive index of the high refraction layer is greater than that of the low refraction layer, the side surface of the low refraction layer facing the light-emitting area is in contact with the high refraction layer to form a total reflection interface, the total reflection interface is configured to allow the display light emitted from the
(Continued)

light-emitting area and incident through the high refraction
layer to perform total reflection.

20 Claims, 8 Drawing Sheets

(56)                         References Cited

FOREIGN PATENT DOCUMENTS

| CN | 113130616 | A | 7/2021 |
|----|-----------|---|--------|
| CN | 113178466 | A | 7/2021 |
| CN | 113394351 | A | 9/2021 |
| CN | 215578616 | U | 1/2022 |
| CN | 114068843 | A | 2/2022 |
| CN | 114242700 | A | 3/2022 |
| CN | 216145641 | U | 3/2022 |

* cited by examiner a b a b

DISPLAY PANEL HAVING TOTAL REFLECTION INTERFACE FORMED BY LOW REFRACTION LAYER AND HIGH REFRACTION LAYER, AND DISPLAY DEVICE

TECHNICAL FIELD

The present disclosure relates to the field of display technology, and in particular to a display panel and a display device.

BACKGROUND

An organic light emitting diode (OLED) is an active light emitting display device, which has advantages such as self-illumination, wide viewing angle, high contrast, low power consumption, wide color gamut, light and thin, and capable of being special-shaped.

With the continuous development of display technology, OLED technology is increasingly used in transparent displays. The transparent display is a technology through which not only an image can be displayed, but also a scene on the opposite side can be seen through the screen. The transparent display technology can realize display functions such as Virtual Reality/Augmented Reality (VR/AR) and Full Display with Camera (FDC).

SUMMARY

The present disclosure provides a display panel, including a display area and a light-transmitting area, the display area is configured to display a screen, and a light-transmitting area is configured to transmit ambient light; the display area includes a first display area and a second display area, and the first display area and the light-transmitting area constitute a transparent display area, the display area includes:

a display substrate including a light-emitting area and a non-light-emitting area surrounding the light-emitting area;

a low refraction layer arranged on an emergent light side of the display substrate, wherein an orthographic projection of the low refraction layer on the display substrate is located in the non-light-emitting area; and a high refraction layer arranged on a side of the low refraction layer facing away from the display substrate, the high refraction layer is configured to cover at least the light-emitting area and a side surface of the low refraction layer facing the light-emitting area;

a refractive index of the high refraction layer is greater than the refractive index of the low refraction layer, the side surface of the low refraction layer facing the light-emitting area and the high refraction layer are in contact with each other to form a total reflection interface, wherein the total reflection interface is configured to allow display light emitted from the light-emitting area and incident through the high refraction layer to perform total reflection.

In an optional implementation, an included angle between the total reflection interface and a plane where the display substrate is located is a first acute angle, and an opening of the first acute angle faces away from the light-emitting area.

In an optional implementation, the first acute angle is greater than or equal to 20° and less than or equal to 80°.

In an optional implementation, the total reflection interface includes a first total reflection interface located in the first display area, and a second total reflection interface located in the second display area; the light-emitting area includes a first light-emitting area located in the first display area and a second light-emitting area located in the second display area; the first total reflection interface is configured to allow a first display light emitted from the first light-emitting area to perform total reflection, and a ratio of the first display light to display light emitted from the first light-emitting area is a first proportion; the second total reflection interface is configured to allow a second display light emitted from the second light-emitting area to perform total reflection, and a ratio of the second display light to display light emitted from the second light-emitting area is a second proportion; an absolute value of a difference between the first proportion and the second proportion is greater than or equal to 0 and less than or equal to 0.3.

In an optional implementation, a size of the first light-emitting area is smaller than a size of the second light-emitting area in a plane where the display substrate is located.

In an optional implementation, the low refraction layer includes a first low refraction layer located in the first display area and a second low refraction layer located in the second display area, a thickness of the first low refraction layer in a normal direction of the display substrate is smaller than a thickness of the second low refraction layer in the normal direction of the display substrate.

In an optional implementation, a difference between the thickness of the second low refraction layer and the thickness of the first low refraction layer is greater than or equal to 0.5 micrometers and less than or equal to 4 micrometers.

In an optional implementation, a critical angle at which the first display light is subjected to total reflection at the first total reflection interface is greater than a critical angle at which the second display light is subjected to total reflection at the second total reflection interface.

In an optional implementation, the low refraction layer includes a first low refraction layer located in the first display area and a second low refraction layer located in the second display area, the refractive index of the first low refraction layer is greater than the refractive index of the second low refraction layer.

In an optional implementation, a difference between the refractive index of the first low refraction layer and the refractive index of the second low refraction layer is greater than or equal to 0.05 and less than or equal to 0.2.

In an optional implementation, the high refraction layer includes a first high refraction layer located in the first display area and a second high refraction layer located in the second display area, the refractive index of the first high refraction layer is smaller than the refractive index of the second high refraction layer.

In an optional implementation, a difference between the refractive index of the second high refraction layer and the refractive index of the first high refraction layer is greater than or equal to 0.05 and less than or equal to 0.2.

In an optional implementation, an included angle between the first total reflection interface and the plane where the display substrate is located is a first included angle, and the first included angle is an acute angle whose opening faces away from the first light-emitting area; an included angle between the second total reflection interface and the plane where the display substrate is located is a second included angle, and the second included angle is an acute angle whose opening faces away from the second light-emitting area; the first included angle is greater than the second included angle.

In an optional implementation, a difference between the first included angle and the second included angle is greater than or equal to 10° and less than or equal to 30°.

In an optional implementation, a minimum distance between an orthographic projection of the first total reflection interface on the display substrate and the first light-emitting area is a first distance, and a minimum distance between an orthographic projection of the second total reflection interface on the display substrate and the second light-emitting area is a second distance, the first distance being greater than the second distance.

In an optional implementation, a difference between the first distance and the second distance is greater than or equal to 3 micrometers and less than or equal to 6 micrometers.

In an optional implementation, an orthographic projection of the low refraction layer on the display substrate does not overlap with the second display area, and in the second display area, the high refraction layer covers the light-emitting area and at least part of the non-light-emitting area.

In an optional implementation, the display panel further includes a flat layer provided on a side of the high refraction layer facing away from the display substrate, a refractive index of the flat layer is smaller than the refractive index of the high refraction layer;

an orthographic projection of the high refraction layer on the display substrate covers the light-emitting area and an edge area of the non-light-emitting area near the light-emitting area;

the high refraction layer and the flat layer are in contact with each other to form a refraction interface, an included angle between the refraction interface and a plane where the display substrate is located is a second acute angle, and an opening of the second acute angle faces the light-emitting area.

In an optional implementation, the high refraction layer includes a first high refraction portion and a second high refraction portion, orthographic projections of the first high refraction portion and the second high refraction portion on the display substrate covering the display area;

the orthographic projection of the first high refraction portion on the display substrate covers the light-emitting area and an edge area in the non-light-emitting area near the light-emitting area; a surface of a side of the first high refraction portion facing away from the display substrate is higher than or at equal altitude to a surface of a side of the second high refraction portion facing away from the display substrate.

The present disclosure provides a display device including any of the display panels described above.

The above description is only a summary of solutions of the present disclosure. In order to learn technical means of the present disclosure more clearly and allow the technical means to be implemented based on the disclosure of the description, and in order to make the above and other objects, features and advantages of the present disclosure more obvious and understandable, specific embodiments of the present disclosure are illustrated below.

BRIEF DESCRIPTION OF THE DRAWINGS

In order to illustrate technical solutions of embodiments of the present disclosure or the related art more clearly, the following will briefly introduce the drawings that need to be used in the description of the embodiments or the related art. Apparently, the drawings in the following description are some embodiments of the present disclosure. For those skilled in the art, other drawings can be obtained according to these drawings without paying creative efforts. It should be noted that the scales shown in the figures are merely schematic and do not represent actual scales.

DETAILED DESCRIPTION OF THE EMBODIMENTS

In order to make the objectives, technical solutions, and advantages of the embodiments of the present disclosure clearer, the technical solutions of the embodiments of the present disclosure will be clearly and completely described below in conjunction with the accompanying drawings of the embodiments of the present disclosure. Apparently, the described embodiments are a part of the embodiments of the present disclosure, rather than all the embodiments. All other embodiments obtained, based on the embodiments of the present disclosure, by those skilled in the art without paying creative effort fall within the scope of the present disclosure.

Since a transparent display area in a display panel has a displaying function and is transparent, transparent display technology has always been the focus of industry research. In the related art, due to the arrangement of a transparent area, the brightness of the screen in the transparent display area is low, or the power consumption is high in the case where the brightness of the screen satisfies the requirements.

Figure 1:
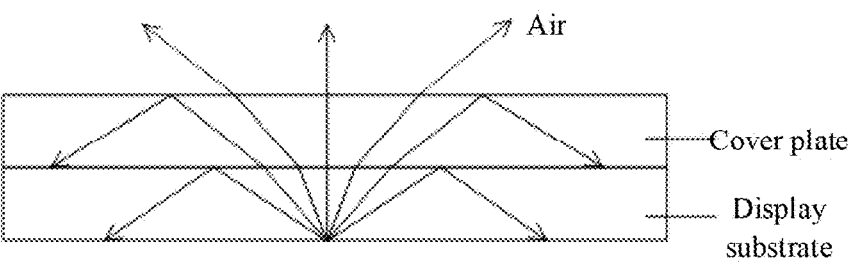
FIG. 1 is a schematic cross-sectional structural view schematically illustrating a display panel in the related art.

It has been found that in a display panel, as shown in FIG. 1, when the display light enters into the air with a low refractive index from a cover plate with a high refractive index, the total internal reflection will occur if an incident angle of the display light at the interface between the cover plate and the air is greater than or equal to the critical angle of total reflection, resulting in low overall emergent light efficiency.

In order to solve the problem that the brightness of the screen in the transparent display area is low, or the power consumption is high in the case where the brightness of the screen satisfies the requirements, the present disclosure provides a display panel including a display area and a light-transmitting area. The display area is used for displaying a picture, and the light-transmitting area is used for transmitting ambient light.

Figure 2:
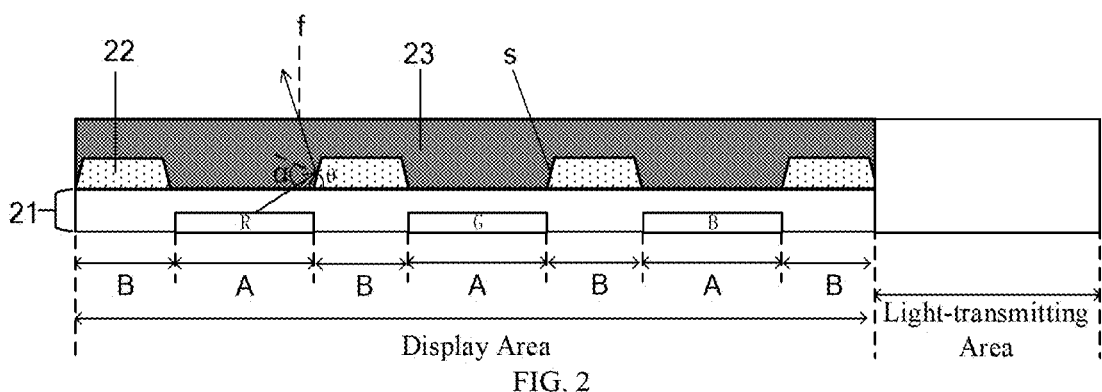
FIG. 2 is a schematic cross-sectional structural view schematically illustrating a display panel provided by the present disclosure.

Reference is made to FIG. 2 which is a schematic cross-sectional structural view schematically illustrating a display panel provided by the present disclosure. As shown in FIG. 2, the display panel in the display area includes: a display substrate 21 including a light-emitting area 'A' and a non-light-emitting area 'B' surrounding the light-emitting area 'A'; a low refraction layer 22 disposed on an emergent light side of the display substrate 21, an orthographic projection of the low refraction layer 22 on the display substrate 21 being located in the non-light-emitting area 'B'; and a high refraction layer 23 disposed on a side of the low refraction layer 22 facing away from the display substrate 21, the high refraction layer 23 covering at least the light-emitting area 'A' and a side surface of the low refraction layer 22 facing the light-emitting area 'A'.

The refractive index of the high refraction layer 23 is greater than the refractive index of the low refraction layer 22. The side surface of the low refraction layer 22 facing the light-emitting area 'A' and the high refraction layer 23 are in contact with each other to form a total reflection interface 's'. The total reflection interface 's' is configured to allow the display light emitted from the light-emitting area 'A' and entered through the high refraction layer 23 to perform total reflection on.

As shown in FIG. 2, in the normal direction 'f' of the display substrate 21, the low refraction layer 22 includes a pair of opposite surfaces, i.e. a surface on a side near the display substrate 21 and a surface on a side facing away from the display substrate 21. The side surface of the low refraction layer 22 facing the light-emitting area 'A' connects the pair of opposite surfaces.

As shown in FIG. 2, for the display light incident on the total reflection interface 's', when the incident angle $\alpha$ is greater than or equal to the critical angle of total reflection, the display light undergoes total reflection on the total reflection interface 's'. The propagation direction of the display light underwent the total reflection approaches toward the normal direction 'f' of the display substrate 21, so that the incident angle of the display light incident on the interface between the cover plate and the air can be reduced. Therefore, the probability that the display light undergoes total internal reflection on the interface between the cover plate and the air can be reduced, and the emergent light efficiency can be improved.

The critical angle of the total reflection is arcsin (n1/n2), where n1 is the refractive index of the low refraction layer 22, and n2 is the refractive index of the high refraction layer 23.

In the display panel provided by the present disclosure, the low refraction layer 22 and the high refraction layer 23 are laminated on the emergent light side of the display substrate 21 to form the total reflection interface 's'. The total reflection interface 's' can deflect the display light originally emitted at an oblique viewing angle towards a forward viewing angle, thereby reducing the probability that the display light undergoes the total internal reflection at the interface between the cover plate and the air, and improving the emergent light efficiency, especially the emergent light efficiency at the front side. In this way, the display brightness of a transparent display area is improved and the power consumption is reduced.

Exemplarily, there may be multiple light-emitting areas 'A'. As shown in FIG. 2, multiple light-emitting areas 'A' may include a red light-emitting area 'R', a green light-emitting area 'G', a blue light-emitting area 'B', etc. which are not limited in the present disclosure.

Light emission can be achieved by providing a light emitting device in the light-emitting area 'A'. The light emitting device may be, for example, an OLED, a Quantum Dot Light-Emitting Diode (QLED), a Mini Light-Emitting Diode (Mini LED), a Micro Light-Emitting Diode (Micro LED), etc. which is not limited in the present disclosure.

In a specific implementation, the low refraction layer 22 may be formed by patterning processes such as exposure development, coating, or ink jet printing. The high refraction layer 23 may be formed by patterning processes such as exposure development, coating, or ink jet printing.

Exemplarily, the material of the high refraction layer may include an organic material such as acryl and an inorganic material such as zirconia, which is not limited in the present disclosure.

Exemplarily, the material of the low refraction layer may include an organic material such as acryl and an inorganic material such as zirconia, which is not limited in the present disclosure.

With regard to the display light incident on the total reflection interface 's' (namely, the display light originally emitted at an oblique viewing angle), when the incident angle $\alpha$ is less than the critical angle of total reflection, the display light is refracted on the total reflection interface 's', enters into the low refraction layer 22, and exits the display panel in an oblique viewing angle direction.

In order to further improve the emergent light efficiency, optionally, an included angle between the total reflection interface 's' and a plane where the display substrate 21 is located is a first acute angle $\theta$, and the opening of the first acute angle $\theta$ faces away from the light-emitting area 'A'.

By setting the included angle between the total reflection interface 's' and the plane where the display substrate 21 is located as an acute angle with the opening facing away from the light-emitting area 'A', more display light in the display light incident on the total reflection interface 's' can undergo the total reflection, that is, the proportion of the display light undergoing the total reflection can be increased, and the proportion of the display light that is refracted on the total reflection interface 's' can be decreased. Therefore, the emergent light efficiency, especially the emergent light efficiency at the front side, can be further improved.

Optionally, the first acute angle θ is greater than or equal to 20° and less than or equal to 80°. Further, the first acute angle θ may be greater than or equal to 30° and less than or equal to 70°, and the first acute angle θ may also be greater than or equal to 40° and less than or equal to 70°.

Figure 3:
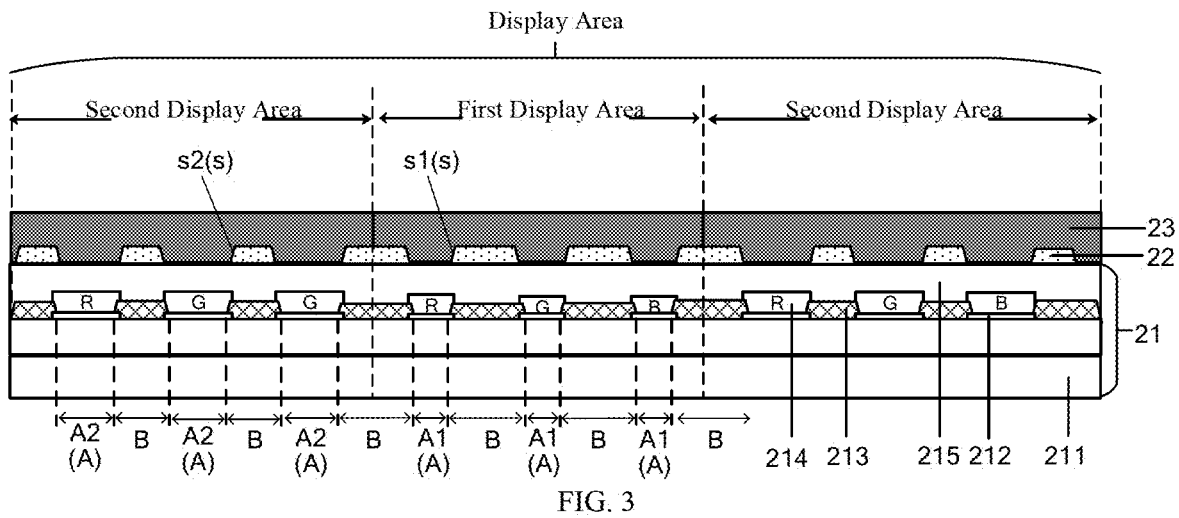
FIG. 3 is a schematic cross-sectional structural view schematically illustrating a first display panel provided by the present disclosure.

Optionally, as shown in FIG. 3, the display area may include a first display area and a second display area. The first display area and the light-transmitting area (not shown in FIG. 3) constituting a transparent display area. The second display area at least partially surrounds the transparent display area.

In order to improve the emergent light efficiency of the entire display area, the total reflection interface 's' may be provided in the first display area and the second display area, respectively. In an alternative implementation mode, as shown in FIG. 3, the total reflection interface 's' includes a first total reflection interface 's1' located in the first display area, and a second total reflection interface 's2' located in the second display area; the light-emitting area 'A' includes a first light-emitting area A1 located in the first display area, and a second light-emitting area A2 located in the second display area.

The first total reflection interface 's1' is used for performing total reflection on first display light emitted from the first light-emitting area A1, and the second total reflection interface 's2' is used for performing total reflection on second display light emitted from the second light-emitting area A2.

By providing the total reflection interface 's' in the first display area and the second display area respectively, i.e. providing the first total reflection interface 's1' in the first display area and providing the second total reflection interface 's2' in the second display area, the emergent light efficiency of the entire display area, especially the emergent light efficiency at the front side, can be improved and the power consumption can be reduced.

The ratio of the first display light to the display light emitted from the first light-emitting area A1 is a first proportion. The ratio of the second display light to the display light emitted from the second light-emitting area A2 is a second proportion. Optionally, the absolute value of the difference between the first proportion and the second proportion is greater than or equal to 0 and less than or equal to 0.3.

When the total reflection interface 's' is provided in both the first display area and the second display area, since the total reflection interface 's' can deflect the display light originally emitted at an oblique viewing angle to the forward viewing angle direction (as shown in FIG. 2), the arrangement of the total reflection interface 's' can reduce the emergent light amount in the oblique viewing angle direction. When the absolute value of the difference between the first proportion and the second proportion is too large, it results in a significant difference in the display of the first display area and the second display area in the oblique viewing angle direction.

By setting the absolute value of the difference between the first proportion and the second proportion to be greater than or equal to 0 and less than or equal to 0.3, it is possible to ensure that the luminance difference between the first display area and the second display area in the oblique viewing angle direction is small, thereby improving the display uniformity of the first display area and the second display area in the oblique viewing angle direction.

In a specific implementation, the first total reflection interface 's1' provided in the first display area may be the same as or different from the second total reflection interface 's2' provided in the second display area.

As shown in FIG. 3, the first total reflection interface 's1' being the same as the second total reflection interface 's2' may specifically includes: the low refraction layer 22 provided in the first display area has the same thickness as the low refraction layer 22 provided in the second display area; the critical angle of total reflection of the first total reflection interface 's1' and the critical angle of total reflection of the second total reflection interface 's2' are the same; the included angle between the first total reflection interface 's1' and the display substrate, and the included angle between the second total reflection interface 's2' and the display substrate are the same; and in the direction of the plane where the display substrate 21 is located, the minimum distance between the first total reflection interface 's1' and the first light-emitting area A1 is equal to the minimum distance between the second total reflection interface 's2' and the second light-emitting area A2; and the like.

Figure 5:
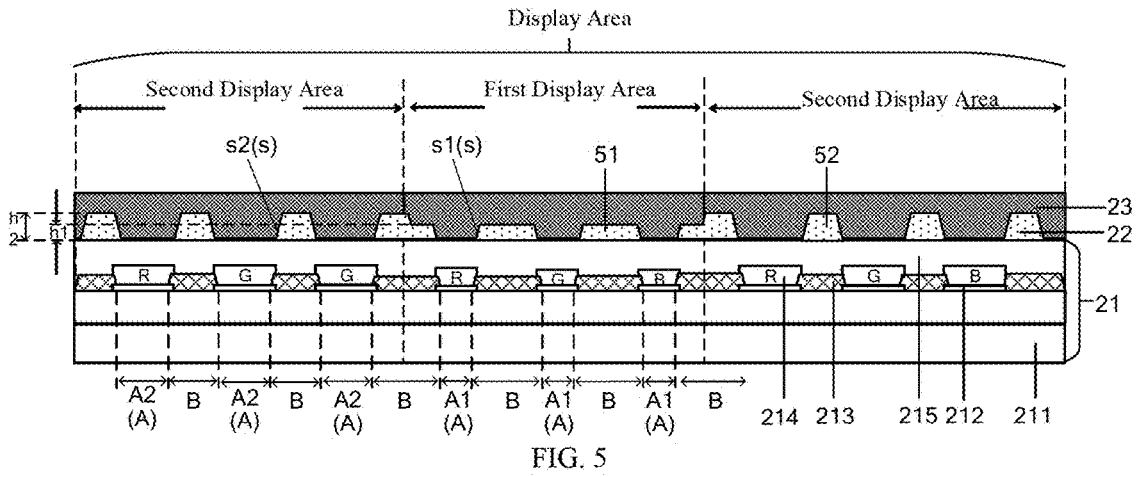
FIG. 5 is a schematic cross-sectional structural view schematically illustrating a second display panel provided by the present disclosure.
Figure 6:
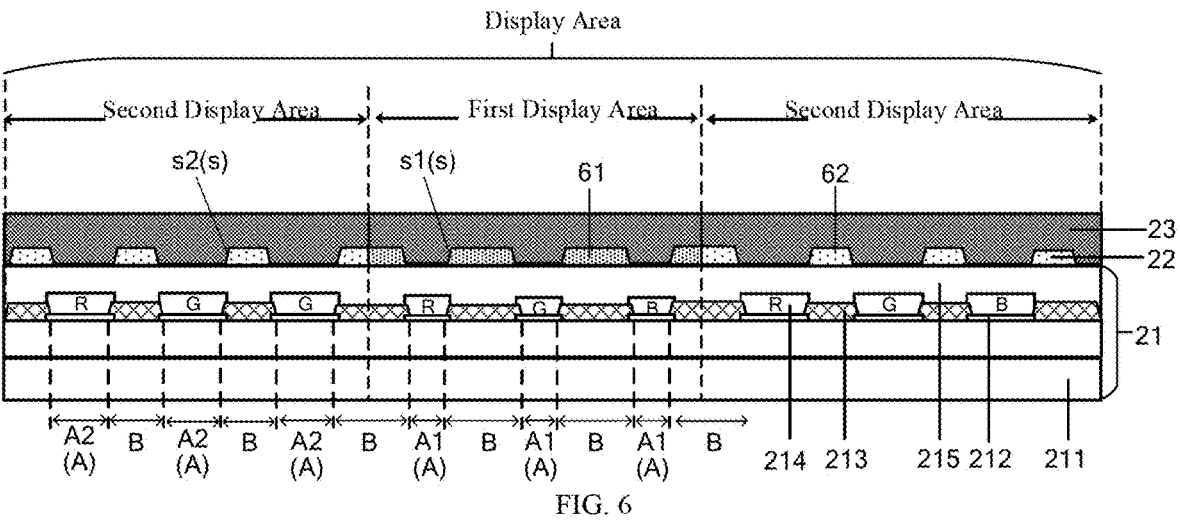
FIG. 6 is a schematic cross-sectional structural view schematically illustrating a third display panel provided by the present disclosure.
Figure 7:
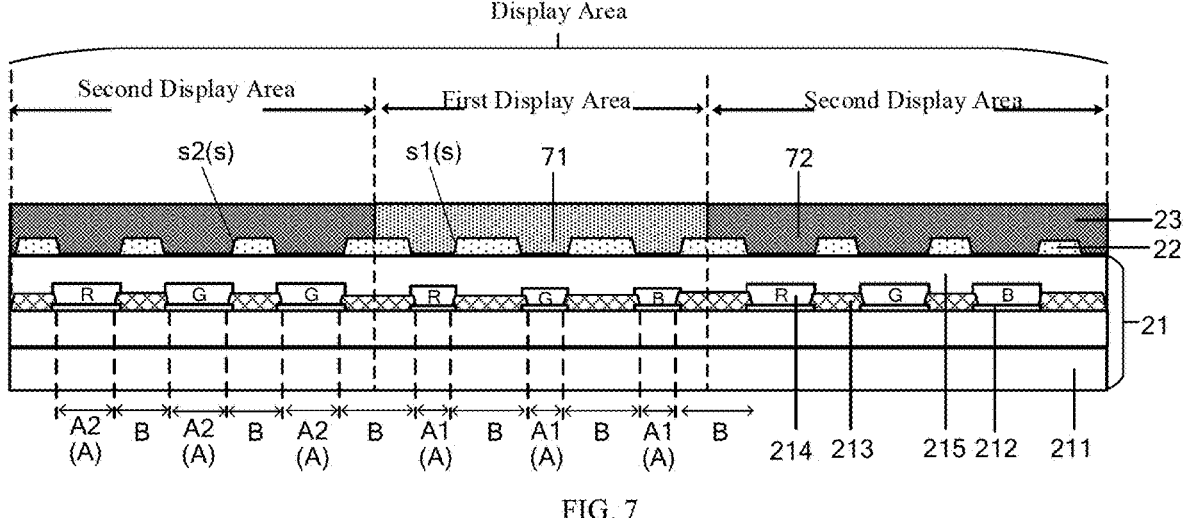
FIG. 7 is a schematic cross-sectional structural view schematically illustrating a fourth display panel provided by the present disclosure.
Figure 8:
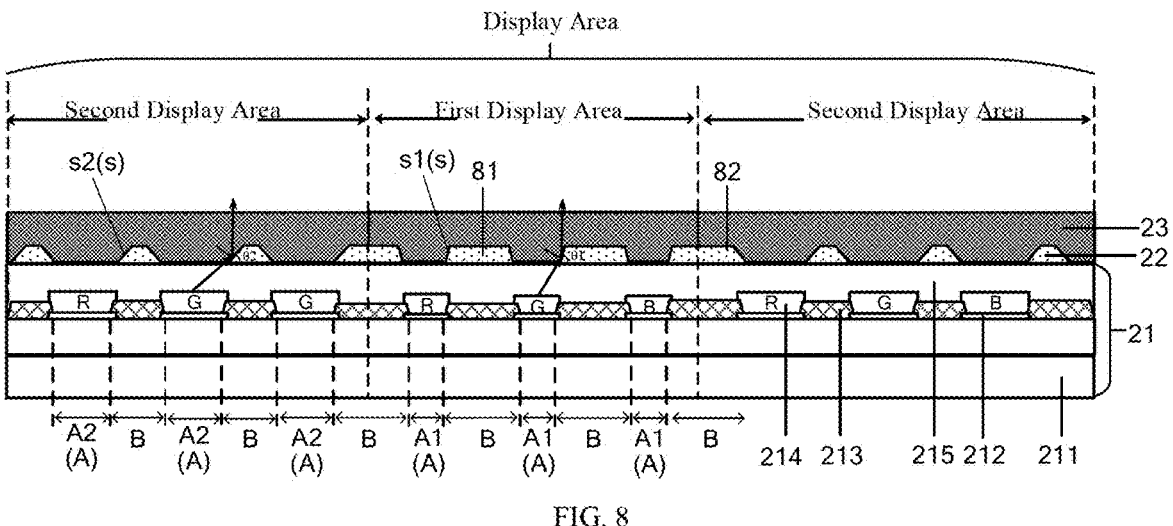
FIG. 8 is a schematic cross-sectional structural view schematically illustrating a fifth display panel provided by the present disclosure.
Figure 10:
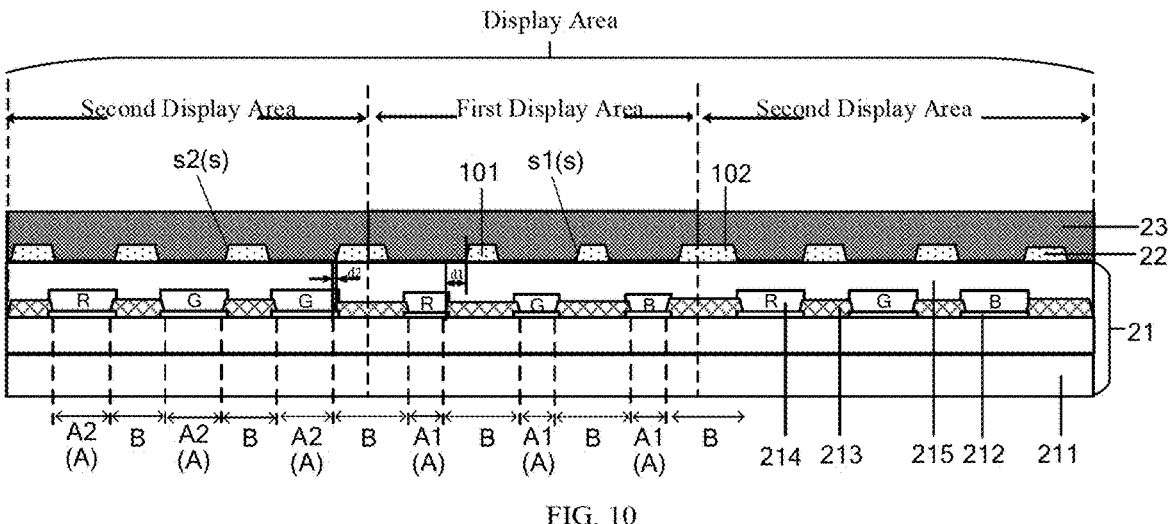
FIG. 10 is a schematic cross-sectional structural view schematically illustrating a sixth display panel provided by the present disclosure.

As shown in FIGS. 5 to 10, the first total reflection interface 's1' being different from the second total reflection interface 's2' may specifically include at least one of the following: the thickness of the low refraction layer 22 provided in the first display area is different from that of the low refraction layer 22 provided in the second display area (as shown in FIG. 5); the critical angle of total reflection of the first total reflection interface 's1' is different from that of the second total reflection interface 's2' (as shown in FIGS. 6 and 7); the included angle between the first total reflection interface 's1' and the display substrate, and the included angle between the second total reflection interface 's2' and the display substrate are different (as shown in FIG. 8);

and in the direction of the plane where the display substrate 21 is located, the minimum distance between the first total reflection interface 's1' and the first light-emitting area A1 is not equal to the minimum distance between the second total reflection interface 's2' and the second light-emitting area A2 (as shown in FIG. 10); and the like.

In a specific implementation, the size relationship between the first light-emitting area A1 and the second light-emitting area A2 in the plane where the display substrate 21 is located can be determined according to practical requirements, for example, the size of the first light-emitting area A1 can be greater than, equal to, or less than the size of the second light-emitting area A2, which is not limited in the present disclosure.

Figure 4:
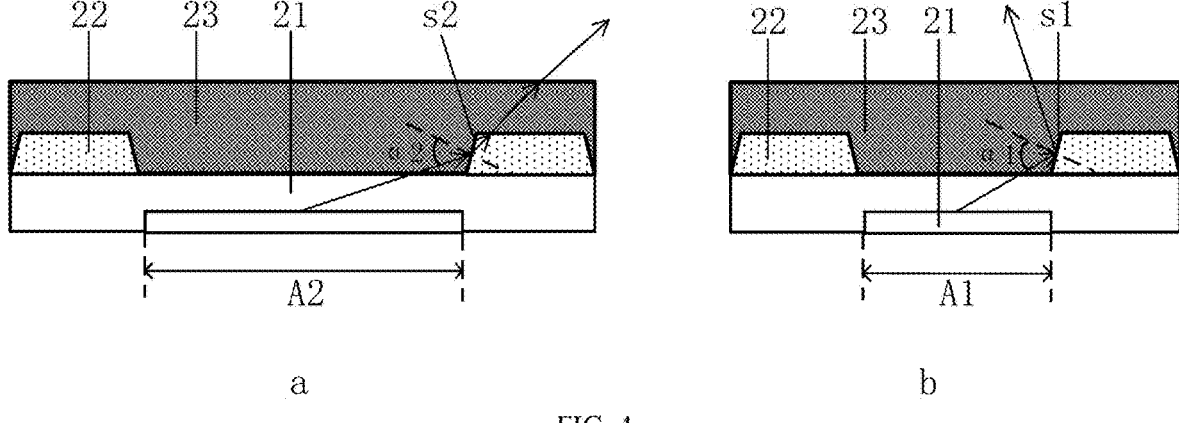
FIG. 4 is a schematic diagram schematically illustrating a first optical path structure provided by the present disclosure.

Optionally, in order to increase the area of the light-transmitting area within the transparent display area and to increase the transmittance of ambient light, the size of the first light-emitting area A1 is smaller than the size of the second light-emitting area A2 in the plane where the display substrate 21 is located, as shown in FIGS. 3 and 4. In a specific implementation, the light-emitting colors of the first light-emitting area A1 and the second light-emitting area A2 satisfying the above-mentioned size relationship may be the same.

Referring to FIG. 4, there is shown a schematic view of a display ray emitted from the center of the first light-emitting area being incident on the first total reflection interface (as shown in figure b in FIG. 4) and a schematic view of a display ray emitted from the center of the second light-emitting area being incident on the second total reflection interface (as shown in figure a in FIG. 4) in the case where the first total reflection interface and the second total reflection interface are the same.

Figure 13:
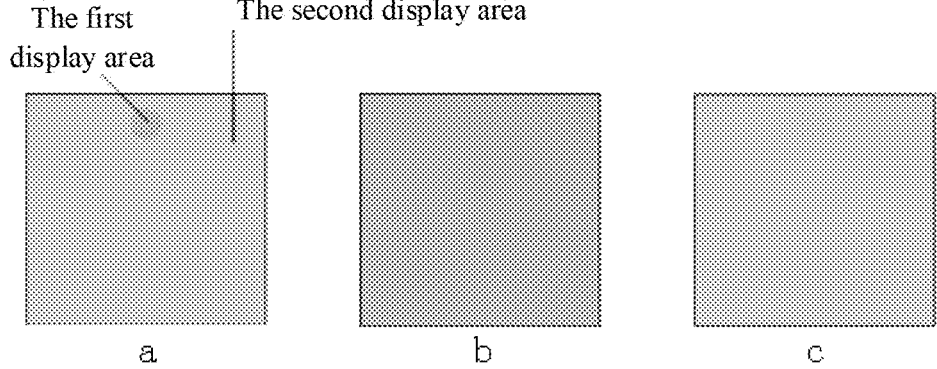
FIG. 13 schematically shows a display simulation screen of several display panels under oblique viewing angles.

As shown in FIG. 4, since the size of the first light-emitting area A1 is smaller than that of the second light-emitting area A2, when the first total reflection interface 's1' is the same as the second total reflection interface 's2', the incident angle $\alpha 1$ at which the display light emitted from the first light-emitting area A1 is incident on the first total reflection interface 's1' is larger, that is, the total reflection is more likely to occur, and more display lights originally emitted from an oblique viewing angle can be deflected to a forward viewing angle direction. A high proportion of total reflection results in a luminance attenuation amplitude in the oblique viewing angle direction of the first display area being greater than that of the second display area in the oblique viewing angle direction, so that the display screens of the first display area and the second display area in the oblique viewing angle direction are significantly different. Figure 'a' in FIG. 13 shows a display simulation screen of the display panel shown in FIG. 3 under the oblique viewing angle of 45°. As shown in figure 'a', the display screens of the first display area and the second display area under the oblique viewing angle of 45° are significantly different.

Figure 12:
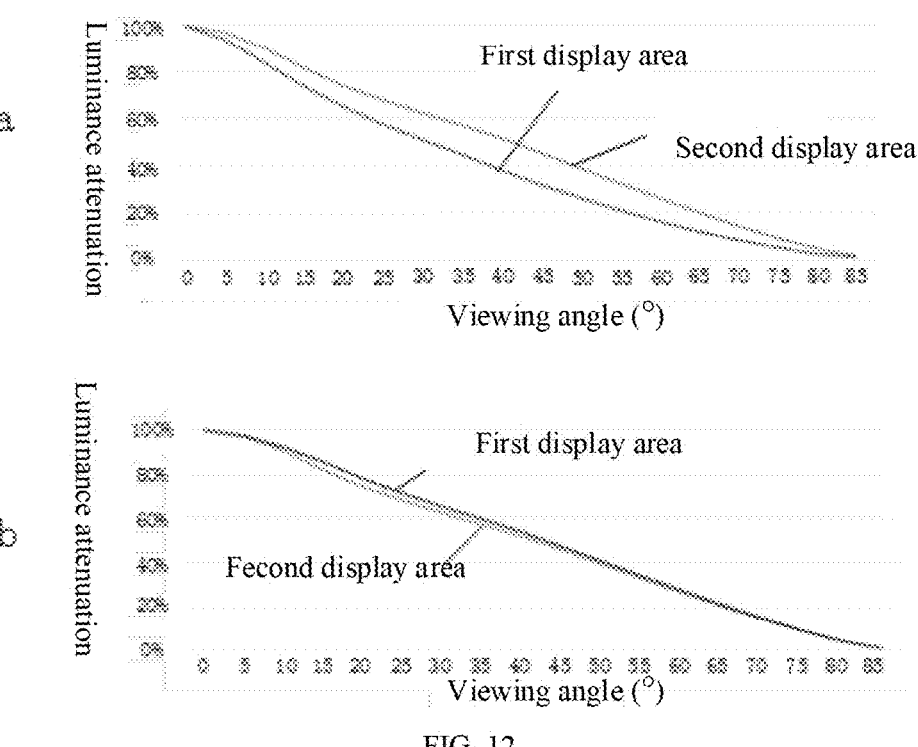
FIG. 12 schematically shows a simulation curve of luminance attenuation of the first display area and the second display area in the first display panel in various viewing angle directions.

Referring to FIG. 12, figure 'a' in FIG. 12 shows luminance attenuation simulation curves of the first display area and the second display area of the display panel shown in FIG. 3 in various viewing angle direction. As can be seen from figure 'a' in FIG. 12, the luminance attenuation amplitude in the oblique viewing angle direction of the first display area is greater than the luminance attenuation amplitude in the oblique viewing angle direction of the second display area. Also, even if the brightness of the first display area and the second display area is made uniform in the forward viewing angle direction by gamma debugging, there is still a large difference in brightness in the oblique viewing angle direction.

In order to improve the uneven brightness of the first display area and the second display area at an oblique viewing angle, the present disclosure provides several implementation modes below.

In a first implementation mode, as shown in FIG. 5, the low refraction layer 22 includes a first low refraction layer 51 located in the first display area, and a second low refraction layer 52 located in the second display area; in the normal direction of the display substrate 21, the thickness h1 of the first low refraction layer 51 is smaller than the thickness h2 of the second low refraction layer 52.

In the present implementation, by providing low refraction layers 22 with different thicknesses in the first display area and the second display area respectively, i.e. providing a lower first low refraction layer 51 in the first display area and providing a higher second low refraction layer 52 in the second display area, the area of the first total reflection interface 's1' receiving the first display light can be reduced, so that the number of total reflections for the first display light occurred at the first total reflection interface 's1' is less than the number of total reflections for the second display light occurred at the second total reflection interface 's2'. Therefore, the difference in the proportion of display lights undergoing total reflection in the first display area and the second display area is reduced, the luminance attenuation amplitude in the oblique viewing angle direction of the first display area is compensated, improving the display uniformity of the first display area and the second display area in the oblique viewing angle direction.

Optionally, the difference between the thickness h2 of the second low refraction layer 52 and the thickness h1 of the first low refraction layer 51 is greater than or equal to 0.5 microns and less than or equal to 4 microns.

Exemplarily, the thickness h2 of the second low refraction layer 52 may be greater than or equal to 3 microns and less than or equal to 5 microns, and the thickness h1 of the first low refraction layer 51 may be greater than or equal to 1.5 microns and less than or equal to 2.5 microns. For example, the thickness h2 of the second low refraction layer 52 may be 4 microns, and the thickness h1 of the first low refraction layer 51 may be 2 microns.

A critical angle at which the first display light undergoes total reflection on the first total reflection interface 's1' is a first critical angle, and a critical angle at which the second display light undergoes total reflection on the second total reflection interface 's2' is a second critical angle. In order to improve the luminance difference between the first display area and the second display area at oblique viewing angles, it is also possible to set the first critical angle to be larger than the second critical angle.

In order to achieve that the first critical angle is greater than the second critical angle, in a second implementation mode, as shown in FIG. 6, the low refraction layer 22 includes a first low refraction layer 61 located in the first display area, and a second low refraction layer 62 located in the second display area; the refractive index of the first low refraction layer 61 is greater than the refractive index of the second low refraction layer 62.

In the present implementation mode, a low refraction layer 22 with different refractive indices is provided in the first display area and the second display area respectively, namely, a first low refraction layer 61 with a higher refractive index is provided in the first display area, and a second low refraction layer 62 with a lower refractive index is provided in the second display area. According to a calculation formula of the critical angle of total reflection arcsin (n1/n2), where n1 is the refractive index of the low refraction layer 22 and n2 is the refractive index of the high refraction layer 23, it can be concluded that when the refractive index of the first low refraction layer 61 is greater than the refractive index of the second low refraction layer 62, the first critical angle corresponding to the first total reflection interface 's1' is greater than the second critical angle corresponding to the second total reflection interface 's2'. Accordingly, the number of total reflections of the first display light occurred at the first total reflection interface 's1' is less than the number of total reflections of the second display light occurred at the second total reflection interface 's2', thereby reducing the difference in the proportion of display lights undergoing total reflection in the first display area and the second display area, compensating the luminance attenuation amplitude in the oblique viewing angle direction of the first display area, and improving the display uniformity of the first display area and the second display area in the oblique viewing angle direction.

In the present implementation mode, the first display area and the second display area may be provided with a high refraction layer 23 having the same refractive index, which is not limited by the present disclosure.

Optionally, the difference between the refractive index of the first low refraction layer 61 and the refractive index of the second low refraction layer 62 is greater than or equal to 0.05 and less than or equal to 0.2.

Exemplarily, the refractive index of the first low refraction layer 61 may be greater than or equal to 1.55 and less than or equal to 1.6, and the refractive index of the second low refraction layer 62 may be greater than or equal to 1.45 and less than or equal to 1.5.

In order to achieve that the first critical angle is greater than or equal to the second critical angle, in a third implementation mode, as shown in FIG. 7, the high refraction layer 23 includes a first high refraction layer 71 located in the first display area, and a second high refraction layer 72 located in the second display area; the refractive index of the first high refraction layer 71 is smaller than that of the second high refraction layer 72.

In the present implementation mode, a high refraction layer 23 with different refractive indices is provided in the first display area and the second display area respectively, namely, a first high refraction layer 71 with a lower refractive index is provided in the first display area, and a second high refraction layer 72 with a higher refractive index is provided in the second display area. According to the calculation formula of the critical angle of total reflection arcsin (n1/n2), where n1 is the refractive index of the low refraction layer 22 and n2 is the refractive index of the high refraction layer 23, it can be concluded that when the refractive index of the first high refraction layer 71 is less than the refractive index of the second high refraction layer 72, the first critical angle corresponding to the first total reflection interface 's1' is greater than the second critical angle corresponding to the second total reflection interface 's2'. Accordingly, the number of total reflections of the first display light occurred at the first total reflection interface 's1' is less than the number of total reflections of the second display light occurred at the second total reflection interface 's2', thereby reducing the difference in the proportion of display lights undergoing total reflection in the first display area and the second display area, compensating the luminance attenuation amplitude in the oblique viewing angle direction of the first display area, and improving the display uniformity of the first display area and the second display area in the oblique viewing angle direction.

In the present implementation mode, the first display area and the second display area may be provided with a low refraction layer 22 having the same refractive index, which is not limited by the present disclosure.

Figure 'b' in FIG. 13 shows a display simulation screen at an oblique viewing angle of 45° of a display panel provided according to the third implementation mode. It can be seen that with the third implementation mode, the display difference between the first display area and the second display area at an oblique viewing angle can be significantly improved.

Optionally, the difference between the refractive index of the second high refraction layer 72 and the refractive index of the first high refraction layer 71 is greater than or equal to 0.05 and less than or equal to 0.2.

Exemplarily, the refractive index of the first high refraction layer 71 may be greater than or equal to 1.6 and less than or equal to 1.65, and the refractive index of the second high refraction layer 72 may be greater than or equal to 1.65 and less than or equal to 1.7. For example, the refractive index of the first high refraction layer 71 may be 1.65, and the refractive index of the second high refraction layer 72 may be 1.7.

In a fourth implementation mode, as shown in FIG. 8, the included angle between the first total reflection interface 's1' and the plane where the display substrate 21 is located is a first included angle θ1, and the first included angle θ1 is an acute angle the opening of which faces away from the first light-emitting area A1; the included angle between the second total reflection interface 's2' and the plane where the display substrate 21 is located is a second included angle θ2, and the second included angle θ2 is an acute angle the opening of which faces away from the second light-emitting area A2.

In this implementation mode, the first included angle θ1 is greater than the second included angle θ2.

In a specific implementation, as shown in FIG. S, a low refraction layer 22 with different slope angles (an acute angle formed by a side face of the low refraction layer 22 facing the light-emitting area 'A' and the plane where the display substrate 21 is located) can be provided in the first display area and the second display area respectively. That is, a first low refraction layer 81 with a larger slope angle is provided in the first display area, and a second low refraction layer 82 with a smaller slope angle is provided in the second display area, so that the first included angle θ1 between the first total reflection interface 's1' and the plane where the display substrate 21 is located is larger than the second included angle θ2 between the second total reflection interface 's2' and the plane where the display substrate 21 is located.

Figure 9:
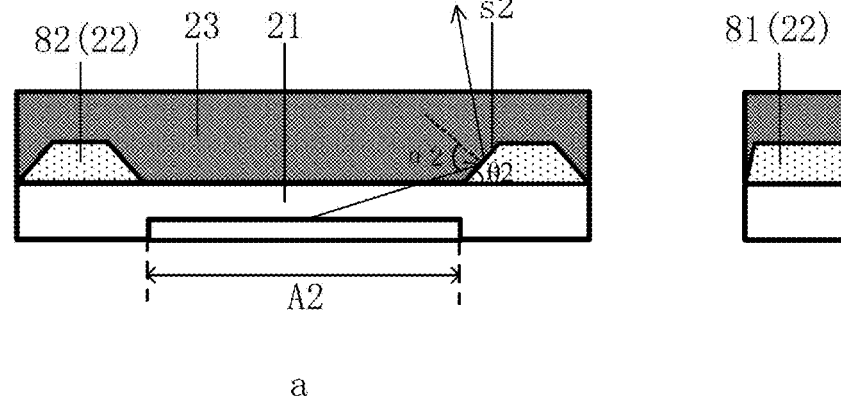
FIG. 9 is a schematic diagram schematically illustrating a second optical path structure provided by the present disclosure.
Figure 9:
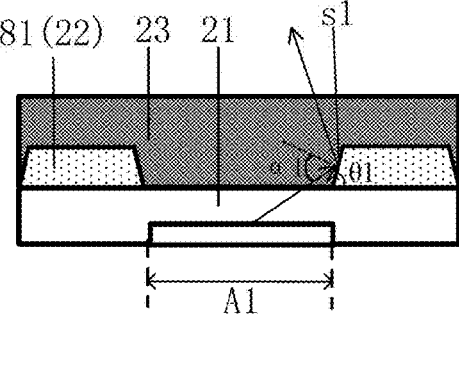

With reference to figure 'a' and figure by' in FIG. 9, since the second included angle θ2 is small, the problem, that the incident angle of the second display light on the second total reflection interface 's2' is small due to the large size of the second light-emitting area A2, can be solved. Therefore, the incident angle α1 of the first display light on the first total reflection interface 's1' and the incident angle α2 of the second display light on the second total reflection interface 's2' are as consistent as possible, and the difference in the proportion of the display lights undergoing total reflection in the first display area and the second display area is reduced, thereby compensating the luminance attenuation amplitude in the oblique viewing angle direction of the first display area, and improving the display uniformity of the first display area and the second display area in the oblique viewing angle direction.

Figure 'c' in FIG. 13 shows a display simulation screen at an oblique viewing angle of 45° of a display panel provided according to the fourth implementation mode. It can be seen that with the fourth implementation mode, the display difference between the first display area and the second display area at an oblique viewing angle can be significantly improved.

Optionally, the difference between the first included angle θ1 and the second included angle θ2 is greater than or equal to 10° and less than or equal to 30°.

Exemplarily, the first included angle θ1 may be greater than or equal to 60° and less than or equal to 70°, and the second included angle θ2 may be greater than or equal to 40° and less than or equal to 50°.

In a fifth implementation mode, as shown in FIG. 10, the minimum distance between an orthographic projection of the first total reflection interface 's1' on the display substrate 21 and the first light-emitting area A1 is a first distance d1, and the minimum distance between an orthographic projection of the second total reflection interface 's2' on the display substrate 21 and the second light-emitting area A2 is a second distance d2, the first distance di being greater than the second distance d2.

In a specific implementation, the first display area and the second display area may be provided with different low refraction layers 22 respectively, namely, a first low refraction layer 101 is provided in the first display area, and a second low refraction layer 102 is provided in the second display area; the minimum distance d1 between the orthographic projection of the first low refraction layer 101 on the display substrate 21 and the first light-emitting area A1 is greater than the minimum distance d2 between the orthographic projection of the second low refraction layer 102 on the display substrate 21 and the second light-emitting area A2. Accordingly, the minimum distance d1 between the orthographic projection of the first total reflection interface 's1' on the display substrate 21 and the first light-emitting area A1 is greater than the minimum distance d2 between the orthographic projection of the second total reflection interface 's2' on the display substrate 21 and the second light-emitting area A2, i.e. the first distance d1 is greater than the second distance d2.

Figure 11:
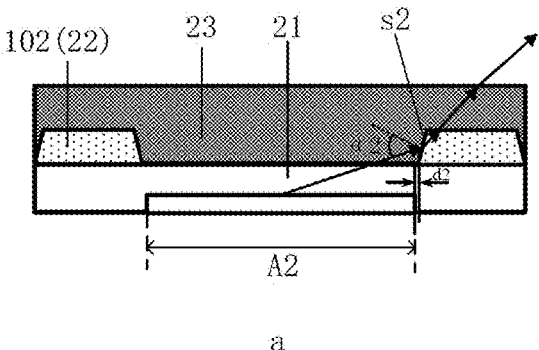
FIG. 11 is a schematic diagram schematically illustrating a third optical path structure provided by the present disclosure.
Figure 11:
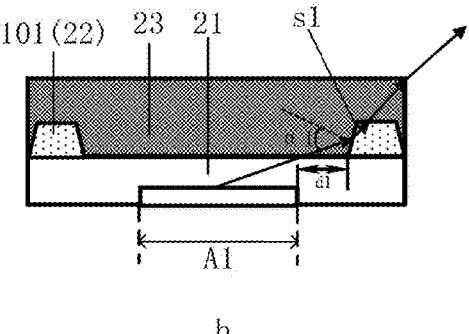

With reference to figure 'a' and figure 'b' in FIG. 11, because the first distance di is larger, it can balance the problem that the incident angle of the first display light on the first total reflection interface 's1' is larger due to the small size of the first light-emitting area A1. Therefore, the incident angle α1 of the first display light on the first total reflection interface 's1' and the incident angle α2 of the second display light on the second total reflection interface 's2' are as consistent as possible, and the difference in the proportion of the display lights undergoing total reflection in the first display area and the second display area is reduced, thereby compensating the luminance attenuation amplitude in the oblique viewing angle direction of the first display area, and improving the display uniformity of the first display area and the second display area in the oblique viewing angle direction.

Optionally, the difference between the first distance d1 and the second distance d2 is greater than or equal to 3 microns and less than or equal to 6 microns.

Exemplarily, the first distance d1 can be greater than or equal to 4 microns and less than or equal to 6 microns, and the second distance d2 can be greater than or equal to 0 micron and less than or equal to 1 micron.

Figure 'b' in FIG. 12 shows the luminance attenuation simulation curves of the first display area and the second display area in various viewing angle directions of the display panel adopting any one of the first implementation mode to the fifth implementation mode. As can be seen from figure 'b' in FIG. 12, the difference in luminance attenuations between the first display area and the second display area in various viewing angle directions is significantly reduced.

Figure 14:
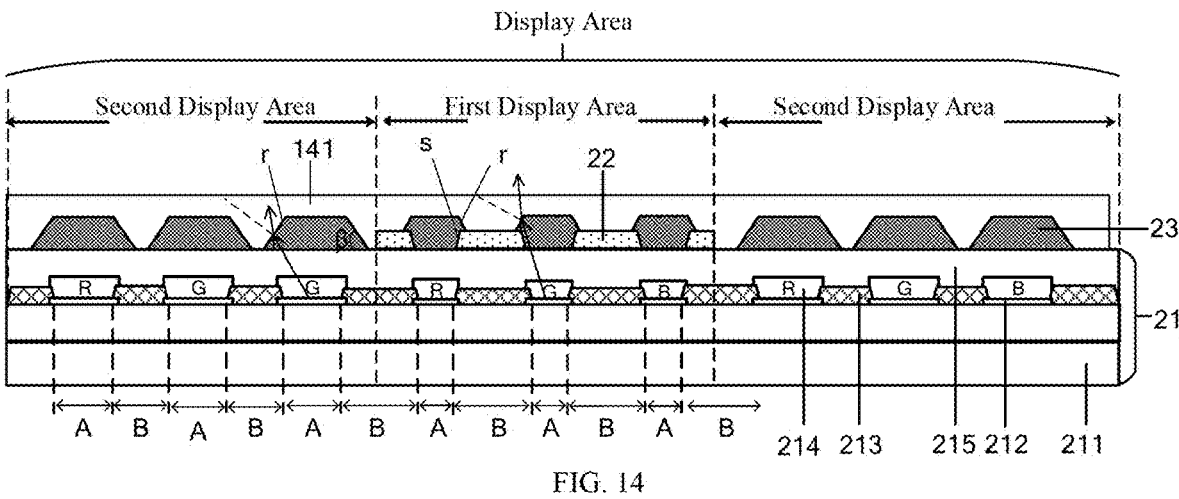
FIG. 14 is a schematic cross-sectional structural view schematically illustrating a seventh display panel provided by the present disclosure.

As shown in FIG. 14, the display area includes a first display area and a second display area, and the first display area and a light-transmitting area (not shown in FIG. 14) constitute a transparent display area. The second display area may at least partially surround the transparent display area.

In a specific implementation, an under-screen camera module may be provided at a position corresponding to the transparent display area, so as to improve the screen-to-body ratio. When taking a picture, the transparent display area transmits light without displaying a picture. and the ambient light can pass through the transparent display area and be collected by the under-screen camera module; when there is no need to take a picture, the transparent display area displays a screen normally, and the under-screen camera module is hidden so that a full screen can be realized in a real sense.

It has been found that, the display of the first display area differs greatly from that of the second display area because, compared with the second display area, a size of the light-emitting area 'A' of the first display area is small or the density of the light-emitting area 'A' is low. The difference is mainly embodied by the low luminance of the first display area.

In order to reduce the display difference between the first display area and the second display area, in an alternative implementation mode, as shown in FIG. 14, the ortho-graphic projection of the low refraction layer 22 on the display substrate 21 does not overlap with the second display area. In the second display area, the high refraction layer 23 covers the light-emitting area 'A' and at least part of the non-light-emitting area 'B'.

In the present embodiment mode, by providing the total reflection interface 's' only in the first display area, it is possible to improve the emergent light efficiency of the first display area, especially the emergent light efficiency at the front side, reduce the difference in the emergent light efficiency at the front side between the first display area and the second display area, and improve the display uniformity at the forward viewing angle of the first display area and the second display area.

In an alternative implementation mode, as shown in FIG. 14, the display panel further includes: a flat layer 141 provided on a side of the high refraction layer 23 facing away from the display substrate 21. The refractive index of the flat layer 141 is less than that of the high refraction layer 23.

In this implementation mode, the orthographic projection of the high refraction layer 23 on the display substrate 21 covers the light-emitting area 'A' and an edge area in the non-light-emitting area 'B' near the light-emitting area 'A'.

Specifically, when the low refraction layer 22 is provided between the high refraction layer 23 and the display sub-strate 21, for example the first display area as shown in FIG. 14, the high refraction layer 23 covers at least the light-emitting area 'A' and a side surface of the low refraction layer 22 facing the light-emitting area 'A'; when no low refraction layer 22 is provided between the high refraction layer 23 and the display substrate 21, for example the second display area shown in FIG. 14, the high refraction layer 23 covers at least an edge area in the non-light-emitting area 'B' near the light-emitting area 'A'.

The side surface of the high refraction layer 23 facing away from the light-emitting area 'A' and the flat layer 141 are in contact with each other to form a refraction interface 'r', the included angle between the refraction interface 'r' and the plane where the display substrate 21 is located is a second acute angle β, and the opening of the second acute angle β faces towards the light-emitting area 'A'. The refraction interface 'r' serves to refract the display light incident on the refraction interface 'r'.

As shown in FIG. 14, the display lights emitted from the light-emitting area 'A' and incident on the refraction interface 'r' through the high refraction layer 23 are refracted. Since the refractive index of the flat layer 141 is smaller than that of the high refraction layer 23, the included angle between the refracted lights entering the flat layer 141 through the refraction interface 'r' and the normal of the refraction interface 'r' increases, so that the refracted lights are closer to the normal direction of the display substrate 21, and thus the emergent light efficiency at the front side can be further improved.

Optionally, as shown in FIG. 14, the orthographic projection of the refraction interface 'r' on the display substrate 21 is in the edge area, i.e. the orthographic projection of the refraction interface 'r' on the display substrate 21 is in the non-light-emitting area.

Figure 15:
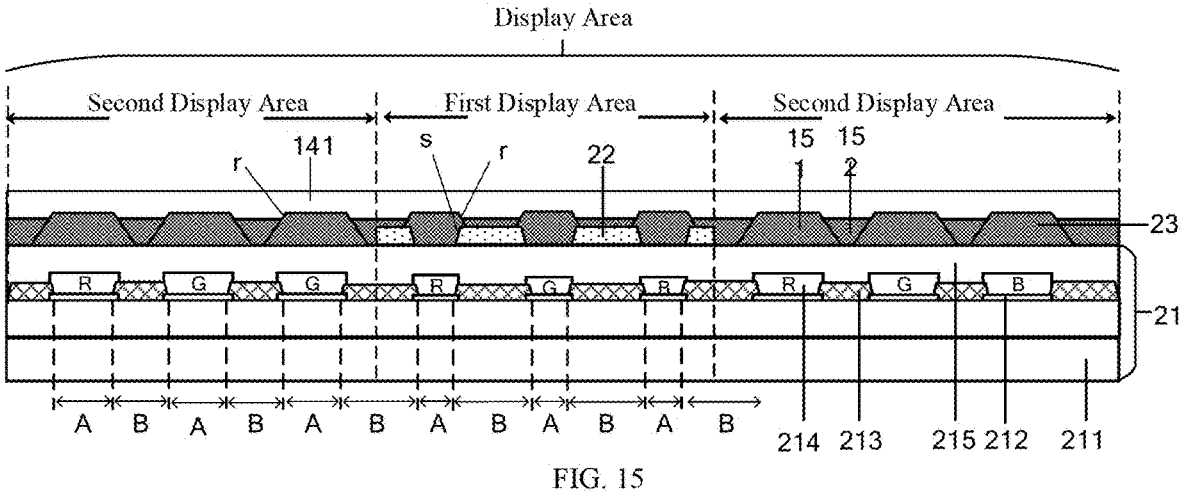
FIG. 15 is a schematic cross-sectional structural view schematically illustrating an eighth display panel provided by the present disclosure.
Figure 16:
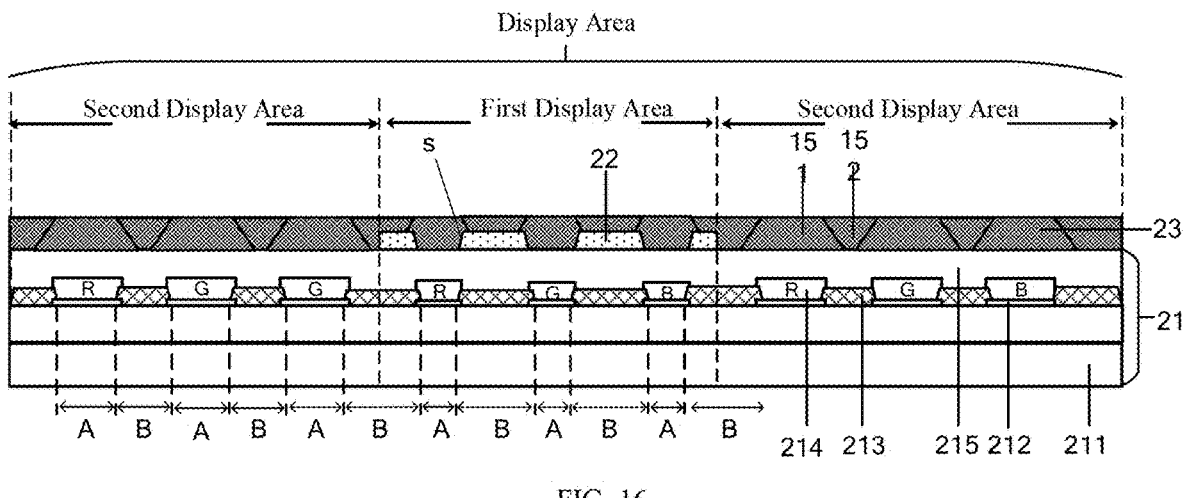
FIG. 16 is a schematic cross-sectional structural view schematically illustrating a ninth display panel provided by the present disclosure.

In an alternative implementation mode, as shown in FIGS. 15 and 16, the high refraction layer 23 includes a first high refraction portion 151 and a second high refraction portion 152, the orthographic projections of the first high refraction portion 151 and the second high refraction portion 152 on the display substrate 21 covering the display area.

The orthographic projection of the first high refraction portion 151 on the display substrate 21 covers the light-emitting area 'A' and the edge area in the non-light-emitting area 'B' near the light-emitting area 'A'; the surface on a side of the first high refraction portion 151 facing away from the display substrate 21 is higher than or at equal altitude to the surface on a side of the second high refraction portion 152 facing away from the display substrate 21.

Specifically, when the low refraction layer 22 is provided between the high refraction layer 23 and the display substrate 21, for example the first display area as shown in FIG. 15 or FIG. 16, the first high refraction portion 151 covers at least the light-emitting area 'A' and a side surface of the low refraction layer 22 facing the light-emitting area 'A'; when no low refraction layer 22 is provided between the high refraction layer 23 and the display substrate 21, for example the second display area shown in FIG. 15 or FIG. 16, the first high refraction portioned portion 151 covers at least an edge area near the light-emitting area 'A' in the non-light-emitting area 'B'.

As shown in FIG. 15, when the surface on a side of the first high refraction portion 151 facing away from the display substrate 21 is higher than the surface on a side of the second high refraction portion 152 facing away from the display substrate 21, a side surface of a portion of the first high refraction portion 151 higher than the second high refraction portion 152 facing away from the light-emitting area 'A' contacts with the flat layer 141 to form the refraction interface 'r'.

As shown in FIG. 16, when the surface on the side of the first high refraction portion 151 facing away from the display substrate 21 as well as the surface on the side of the second high refraction portion 152 facing away from the display substrate 21 are at equal altitude, that is, the surface on the side of the high refraction layer 23 facing away from the display substrate 21 is a flat surface, the high refraction layer 23 may be multiplexed as the flat layer.

Exemplarily, as shown in FIG. 3, the display substrate 21 may include film layers such as a base 211, a first electrode layer 212, a pixel definition layer 213, a light-emitting layer 214, a second electrode layer (not shown in the figure), and an encapsulation layer 215, which are sequentially stacked in the emergent light direction. The encapsulation layer serves to protect the light emitting substrate.

The pixel definition layer 213 includes an opening area and a non-opening area, wherein the opening area corresponds to the light-emitting area 'A', and the non-opening area corresponds to the non-light-emitting area 'B'.

Figure 17:
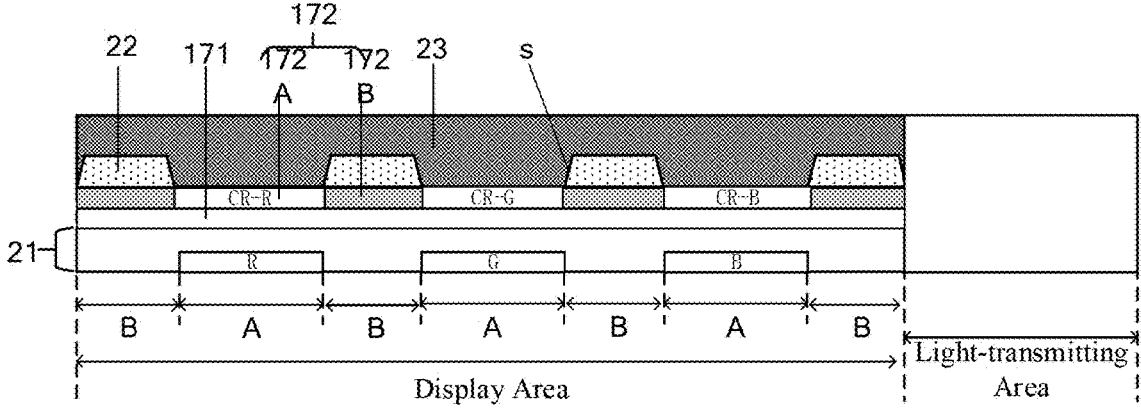
FIG. 17 is a schematic cross-sectional structural view schematically illustrating a tenth display panel provided by the present disclosure.

Exemplarily, as shown in FIG. 17, the display panel may further include one or more of functional layers, such as a touch layer 171 and a built-in polarizing layer 172, which are sequentially stacked between the display substrate 21 and the low refraction layer 22 in the emergent light direction. The touch layer 171 is used for realizing the touch function of the display panel. The built-in polarizing layer 172 serves to reduce the reflection of ambient light by the display substrate.

In FIG. 17, the touch layer 171 is provided close to the display substrate 21, and the built-in polarizing layer 172 is provided on a side of the touch layer 171 facing away from the display substrate 21. In a specific implementation, the positions of the touch layer 171 and the built-in polarizing layer 172 can be interchanged, for example, the case that the built-in polarizing layer 172 can be arranged close to the display substrate 21, and the touch layer 171 is arranged on the side of the built-in polarizing layer 172 facing away from the display substrate 21, which is not limited in the present disclosure.

Optionally, the built-in polarizing layer 172 may include a color resistance portion 172A and a light-shielding portion 172B. The orthographic projection of the color resistance portion 172A on the display substrate 21 covers the light-emitting area 'A', and the orthographic projection of the light-shielding portion 172B on the display substrate 21 is located in the non-light-emitting area 'B'. The color resistance portion 172A and the light-emitting area 'A', positions of which correspond to each other in the normal direction of the display substrate 21. may have the same color. For example, the color resistance portion 172A provided corresponding to the red light emitting area R is a red color resistance CR-R, the color resistance portion 172A provided corresponding to the green light emitting area G is a green color resistance CR-G, and the color resistance portion 172A provided corresponding to the blue light emitting area B is a blue color resistance CR-B.

In a specific implementation, the display panel provided by the present disclosure may further include a cover plate (not shown in the figure) provided on the side of the high refraction layer 23 facing away from the display substrate 21. The material of the cover plate may be, for example, transparent polyimide or glass, etc. which is not limited in the present disclosure.

The present disclosure provides a display device including any display panel provided above.

Since the display device includes the display panel described above, it could be understood by those skilled in the art that the display device has the advantages of the display panel provided by the present disclosure, and will not be described in detail herein.

It should be noted that the display device in the embodiment may be any product or component having 2D or 3D display function such as a display panel, electronic paper, a mobile phone, a tablet computer, a television, a notebook computer, a digital photo frame, virtual reality equipment, augmented reality equipment, under-screen camera equipment, and a navigator.

The present disclosure provides a method for manufacturing a display module, the display panel including a display area for displaying a screen and a light-transmitting area for transmitting ambient light. The manufacturing method of the display area includes steps described blow.

At step S01, a display substrate is provided, and the display substrate includes a light-emitting area 'A' and a non-light-emitting area surrounding the light-emitting area.

At step S02, a low refraction layer is formed on the emergent light side of the display substrate, an orthographic projection of the low refraction layer on the display substrate being located in the range of the non-light-emitting area.

At step S03, a high refraction layer is formed on a side of the low refraction layer facing away from the display substrate, the high refraction layer covering at least the light-emitting area 'A' and a side surface of the low refraction layer facing the light-emitting area.

The refractive index of the high refraction layer is greater than the refractive index of the low refraction layer. The side surface of the low refraction layer facing the light-emitting area and the high refraction layer are in contact with each other to form a total reflection interface. The total reflection interface is used for performing total reflection on display light emitted from the light-emitting area and incident through the high refraction layer.

Any display module provided above can be manufactured by using a manufacturing method provided in the present disclosure.

Each embodiment in the present description is described in a progressive manner, and each embodiment focuses on the differences from other embodiments, and the same and similar parts between the various embodiments can be referred to each other.

Finally, it should be noted that the relational terms such as "the first" and "the second", and the like herein are merely intended to distinguish one entity or operation from another entity or operation without necessarily requiring or implying any actual such relationship or order between such entities or operations. Furthermore, the terms "comprises", "comprising", or any other variation thereof, are intended to cover a non-exclusive inclusion, such that a process, a method, an article, or equipment that comprises a list of elements not only includes those elements but also includes other elements not expressly listed or elements inherent to such process, method, article, or equipment. An element defined by the phrase "including one" does not, without more constraints, preclude the existence of additional identical elements in the process, method, article, or equipment that includes the element.

The above describes a display panel and a display device provided by the present disclosure in detail. Specific examples are used herein to illustrate the principles and implementation modes of the present disclosure. The description of the above embodiments is only used to help understand the methods and core ideas of the present disclosure; at the same time, for those of ordinary skills in the art, according to the idea of the present disclosure, there will be changes in the specific implementation mode and application scope. To sum up, the content of this description should not be understood as a limitation of the present disclosure.

Other implementation modes of the present disclosure will be apparent to those skilled in the art from the consideration of the description and the practice of the invention disclosed herein. The present disclosure is intended to cover any variant, use, or adaptive change of the present disclosure. These variants, uses, or adaptive changes follow the general principles of the present disclosure and include the common knowledge or commonly used technical means in the technical field not disclosed in the present disclosure. The description and the embodiments are only regarded as exemplary. The true scope and spirit of the present disclosure are indicated by the following claims.

It should be understood that the present disclosure is not limited to the precise structures described above and shown in the accompanying drawings, and that various modifications and changes may be made without departing from the scope of the present disclosure. The scope of the present disclosure is limited only by the appended claims.

The terms "one embodiment". "an embodiment", or "one or more embodiments" as used herein mean that a particular feature, structure, or characteristic described in connection with the embodiment is included in at least one embodiment of the present disclosure. In addition, please note that the word example "in one embodiment" does not necessarily refer to the same embodiment.

In the description provided herein, numerous specific details are set forth. However, it could be understood that embodiments of the disclosure may be practiced without these specific details. In some instances, well-known methods, structures, and techniques have not been shown in detail in order not to obscure the understanding of this description.

In the claims, any reference sign placed in a bracket shall not be construed as limiting the claims. The word "comprising" does not exclude the presence of an element or a step other than those listed in a claim. The word "a" or "one" preceding an element does not exclude the presence of multiple such elements. The disclosure can be implemented by means of hardware comprising several distinct elements, and by means of a suitably programmed computer. In a unit claim enumerating several devices, several devices of these devices can be specifically embodied by one and the same item of hardware. The use of the words first, second, third, etc. does not denote any order. These words may be interpreted as names.

Finally, it should be noted that: the above embodiments are provided only to illustrate the technical solutions of the present disclosure, not to limit it; while the present disclosure has been described in detail with reference to the foregoing embodiments, those of ordinary skills in the art should understand that: the technical solutions disclosed in the above-mentioned embodiments can still be modified, or some of the technical features can be replaced by equivalents; such modifications and substitutions do not make the essence of the corresponding technical solutions depart from the spirit and scope of the technical solutions of the embodiments of the present disclosure.

The invention claimed is:

1. A display panel, comprising a display area and a light-transmitting area, wherein the display area is configured to display a screen, and a light-transmitting area is configured to transmit ambient light; wherein the display area comprises a first display area and a second display area, and the first display area and the light-transmitting area constitute a transparent display area; wherein the display area comprises:

a display substrate comprising a light-emitting area and a non-light-emitting area surrounding the light-emitting area;

a low refraction layer arranged on an emergent light side of the display substrate, wherein an orthographic projection of the low refraction layer on the display substrate is located in the non-light-emitting area; and a high refraction layer arranged on a side of the low refraction layer facing away from the display substrate, wherein the high refraction layer is configured to cover at least the light-emitting area and a side surface of the low refraction layer facing the light-emitting area;

wherein a refractive index of the high refraction layer is greater than the refractive index of the low refraction layer, the side surface of the low refraction layer facing the light-emitting area and the high refraction layer are in contact with each other to form a total reflection interface, wherein the total reflection interface is configured to allow display light emitted from the light-emitting area and incident through the high refraction layer to perform total reflection.

2. The display panel according to claim 1, wherein an included angle between the total reflection interface and a plane where the display substrate is located is a first acute angle, and an opening of the first acute angle faces away from the light-emitting area.

3. The display panel according to claim 2, wherein the first acute angle is greater than or equal to 20° and less than or equal to 80°.

4. The display panel according to claim 1, wherein the total reflection interface comprises a first total reflection interface located in the first display area, and a second total reflection interface located in the second display area; the light-emitting area comprises a first light-emitting area located in the first display area and a second light-emitting area located in the second display area;

wherein the first total reflection interface is configured to allow a first display light emitted from the first light-emitting area to perform total reflection, and a ratio of the first display light to display light emitted from the first light-emitting area is a first proportion; the second total reflection interface is configured to allow a second display light emitted from the second light-emitting area to perform total reflection, and a ratio of the second display light to display light emitted from the second light-emitting area is a second proportion; an absolute value of a difference between the first proportion and the second proportion is greater than or equal to 0 and less than or equal to 0.3.

5. The display panel according to claim 4, wherein a size of the first light-emitting area is smaller than a size of the second light-emitting area in a plane where the display substrate is located.

6. The display panel according to claim 5, wherein the low refraction layer comprises a first low refraction layer located in the first display area and a second low refraction layer located in the second display area, wherein a thickness of the first low refraction layer in a normal direction of the display substrate is smaller than a thickness of the second low refraction layer in the normal direction of the display substrate.

7. The display panel according to claim 6, wherein a difference between the thickness of the second low refraction layer and the thickness of the first low refraction layer is greater than or equal to 0.5 micrometers and less than or equal to 4 micrometers.

8. The display panel according to claim 5, wherein a critical angle at which the first display light is subjected to total reflection at the first total reflection interface is greater than a critical angle at which the second display light is subjected to total reflection at the second total reflection interface.

9. The display panel according to claim 8, wherein the low refraction layer comprises a first low refraction layer located in the first display area and a second low refraction layer located in the second display area, wherein the refractive index of the first low refraction layer is greater than the refractive index of the second low refraction layer.

10. The display panel according to claim 9, wherein a difference between the refractive index of the first low refraction layer and the refractive index of the second low refraction layer is greater than or equal to 0.05 and less than or equal to 0.2.

11. The display panel according to claim 8, wherein the high refraction layer comprises a first high refraction layer located in the first display area and a second high refraction layer located in the second display area, wherein the refractive index of the first high refraction layer is smaller than the refractive index of the second high refraction layer.

12. The display panel according to claim 11, wherein a difference between the refractive index of the second high refraction layer and the refractive index of the first high refraction layer is greater than or equal to 0.05 and less than or equal to 0.2.

13. The display panel according to claim 5, wherein an included angle between the first total reflection interface and the plane where the display substrate is located is a first included angle, and the first included angle is an acute angle whose opening faces away from the first light-emitting area;

an included angle between the second total reflection interface and the plane where the display substrate is located is a second included angle, and the second included angle is an acute angle whose opening faces away from the second light-emitting area; the first included angle is greater than the second included angle.

14. The display panel according to claim 13, wherein a difference between the first included angle and the second included angle is greater than or equal to 10° and less than or equal to 30°.

15. The display panel according to claim 5, wherein a minimum distance between an orthographic projection of the first total reflection interface on the display substrate and the first light-emitting area is a first distance, and a minimum distance between an orthographic projection of the second total reflection interface on the display substrate and the second light-emitting area is a second distance, the first distance being greater than the second distance.

16. The display panel according to claim 15, wherein a difference between the first distance and the second distance is greater than or equal to 3 micrometers and less than or equal to 6 micrometers.

17. The display panel according to claim 1, wherein an orthographic projection of the low refraction layer on the display substrate does not overlap with the second display area, and in the second display area, the high refraction layer covers the light-emitting area and at least part of the non-light-emitting area.

18. The display panel according to claim 1, further comprising a flat layer provided on a side of the high refraction layer facing away from the display substrate, wherein a refractive index of the flat layer is smaller than the refractive index of the high refraction layer;

wherein an orthographic projection of the high refraction layer on the display substrate covers the light-emitting area and an edge area of the non-light-emitting area near the light-emitting area;

wherein the high refraction layer and the flat layer are in contact with each other to form a refraction interface, an included angle between the refraction interface and a plane where the display substrate is located is a second acute angle, and an opening of the second acute angle faces the light-emitting area.

19. The display panel according to claim 1, wherein the high refraction layer comprises a first high refraction portion and a second high refraction portion, orthographic projections of the first high refraction portion and the second high refraction portion on the display substrate covering the display area;

wherein the orthographic projection of the first high refraction portion on the display substrate covers the light-emitting area and an edge area in the non-light-emitting area near the light-emitting area; a surface of a side of the first high refraction portion facing away from the display substrate is higher than or at equal altitude to a surface of a side of the second high refraction portion facing away from the display substrate.

20. A display device comprising the display panel according to claim 1.

* * * * *